United States Patent [19]

Hendel

[11] Patent Number: 5,223,811
[45] Date of Patent: Jun. 29, 1993

[54] ELECTROMAGNETIC RELAY HAVING A SEALED HOUSING

[75] Inventor: Horst Hendel, Berlin, Fed. Rep. of Germany

[73] Assignee: Siemens Aktiengesellschaft, Munich, Fed. Rep. of Germany

[21] Appl. No.: 769,247

[22] Filed: Oct. 1, 1991

[30] Foreign Application Priority Data

Nov. 9, 1990 [EP] European Pat. Off. ........ 90121499.9

[51] Int. Cl.⁵ .............................................. H01H 9/02
[52] U.S. Cl. ...................................... 335/202; 335/78
[58] Field of Search ................................... 335/78-86, 335/124, 128, 131, 202; 174/52.2

[56] References Cited

U.S. PATENT DOCUMENTS

| | | | |
|---|---|---|---|
| 3,387,240 | 6/1968 | Koppensteiner | 335/151 |
| 3,434,079 | 3/1969 | Ege et al. | 335/78 |
| 3,522,564 | 8/1970 | Mori et al. | 335/128 |
| 3,602,852 | 8/1971 | Brackett et al. | 335/202 |
| 3,838,316 | 9/1974 | Brown et al. | |
| 3,940,722 | 2/1976 | Fox et al. | 335/151 |

FOREIGN PATENT DOCUMENTS 0262622 4/1988 European Pat. Off. .
3706100 9/1988 Fed. Rep. of Germany .
2529428 12/1983 France .
2080628 2/1982 United Kingdom .

*Primary Examiner*—Lincoln Donovan
*Attorney, Agent, or Firm*—Hill, Steadman & Simpson

[57] ABSTRACT

Electromagnetic relay having a sealed housing. The relay has a housing with a cap and a bottom part. The region of the bottom part under the coil winding has a bottom section that is set back in height, as a result whereof the space between the coil flanges and under the winding also becomes accessible from the outside when the relay is attached to a printed circuit board. The bottom part may potentially have cup-shaped bellied portions as an envelope for the coil flanges. The joining seam between the at least partially height-offset bottom part and the shortened cap is upwardly displaced in this way from the lower terminating plane at least to the lower apex of the coil winding. The relay housing can be sealed with casting resin in this joining plane, whereby clearances in the lower terminating plane of the housing as well as in the height-offset joining plane can be sealed in common using a capillary system. Additional components can be arranged on the printed circuit board in the free space under the winding. Moreover, the space under the relay is more easily accessible for cleaning the printed circuit board.

17 Claims, 5 Drawing Sheets

5,223,811

ELECTROMAGNETIC RELAY HAVING A SEALED HOUSING

BACKGROUND OF THE INVENTION

The present invention is directed to an electromagnetic relay. Relays usually cover a relatively large area on a printed circuit board even though the terminal pins are generally arranged in comparatively small regions under a flange thereof. By contrast, the space between the flanges, that is, under the coil winding (for a horizontal coil axis) is typically not used for a contacting on the printed circuit board, so that this surface region of the printed circuit board is lost for the wiring. Although an unexploited space would already be present under and next to the winding due to the cylindrical winding, this space is also enclosed in a cuboid housing given encapsulation of the relay, so that it can no longer be externally utilized. The cuboid housing is selected because this is the simplest way to implement a seal between a cap extending down to the surface of the printed circuit board and a corresponding bottom plate. Given traditional sealing, casting resin is applied onto the bottom part in the region of the lower terminating surface and is distributed to all sealing seams and passages in one and the same plane, for example by capillary channels.

German reference DE 37 06 100 A1 discloses a chamber indented from a lower terminating surface upward toward the winding that is provided in the bottom part, a component also being potentially arranged in this indented chamber under the relay. The sealing seam between the cap and bottom part, however, also extends all around in the region of the lower terminating surface in this case, so that the chamber, at any rate, is no longer accessible after the relay has been put in place on the printed circuit board. A further disadvantage of the large-area, cuboid housing is that the entire surface under the winding cannot be aerated and cleaned in soldering and washing processes, and as a result residues of soldering agents and washing agents remain in this region. A component in such a chamber could suffer damage from such residues.

SUMMARY OF THE INVENTION

The present invention is directed to an electromagnetic relay having the following features: a housing having a cap and a bottom part; a coil body having a winding applied between two flanges arranged in the housing; at least one of the flanges together with terminal elements anchored therein projecting beyond the circumference of the winding in the direction toward the under side of the relay up to a lower terminating surface of the housing; terminal elements emerging from the relay in the region of the lower terminating surface; and passages in the bottom part and a sealing seam between the bottom part and the cap sealed with casting resin. It is an object of the present invention to provide useful dead space below and to the side of the winding, that is, between the winding cylinder and the lower terminating plane of the relay, the space being accessible from the outside. It is a further object to provide a closed housing that can be sealed in a simple manner and in a single working cycle.

This object is inventively achieved in that the region of the floor part under the winding has a bottom section that is height-offset at least up to the outside circumference of the winding, this floor section comprising, together with the cap shortened up to this floor section, a joining plane comprising a sealing seam, this joining plane being height-offset relative to the lower terminating plane.

As a result of the inventively provided height offset of the joining plane between cap and floor part including the sealing seam from the lower terminating plane of the relay into a higher region that lies in the area of the lower apex line of the winding, a free space that is accessible from the outside can be created under the winding. This height-offset sealing seam can be supplied with casting resin in a single working cycle and with known methods.

In order to be able to optimally exploit the space under and next to the coil winding that is not filled up with the coil winding, it can also be provided that the height-offset bottom section and the joining plane to the cap at both sides of the winding lie higher than the lower apex of this winding, whereby the bottom part then surrounds the lower apex region of the winding in this case with a rounded section adapted thereto. In an expedient embodiment, the sealing seam between the cap and the bottom part proceeds all around at the level of the height-offset bottom section, whereby the bottom part has a cup-shaped bellied portion embracing at least one flange of the coil body that projects downward to the lower terminating plane. At, for example, the level of the lower terminating plane, this cup-like bellied portion can then be provided with clearances for the individual terminal pins or with common clearances for a respective plurality of terminal pins.

Expediently, the bottom part comprises capillary channels both on the respective bellied portion in the lower terminating plane as well as in the height-offset bottom section, these capillary channels respectively connecting a filling location for liquid casting resin to the clearances in the bottom part or, respectively, to the sealing seam in the joining plane. It is thereby especially advantageous when a common filling location is provided that is in communication both with the clearances in the region of the lower terminating surface as well as with the sealing seam in the joining plane. The casting resin can be distributed from the common filling location to the two planes via capillary channels in the vertically or obliquely proceeding connecting walls between the different planes. The filling location, of course, is expediently provided in the lower terminating plane since the casting resin, when the relay is turned over, flows more easily from the higher plane to the lower. In general, the shape and dimensioning of the filling locations and of the distribution channels can be selected in a traditional way, as disclosed, for example, in German reference DE 30 26 371 A1, in European reference EP 0 262 622 A1 or in German reference DE 90 11 111 U; for example, ribs can also be provided instead of channels.

One or more clearances can be provided in the respective, cup-shaped bellied portion of the bottom part in the region of the lower terminating plane of the relay, terminal elements clad individually or in common by flange projections of the coil body being conducted toward the outside through these clearances instead of individual terminal pins. In this case, a sealing occurs between the flange projections and the bottom part, as well as potentially between the terminal pins and the flange projections of the coil body. The additional sealing of the terminal pins themselves is not required when these are already tightly embedded in the coil body.

However, it is also possible that the height-offset bottom section extends at least beyond one of the flanges toward the edge of the cap without the cup-shaped bellied portion. Clearances for terminal pins are then provided in this bottom section, whereby these terminal pins are expediently clad by column-shaped coil body projections that extend down to the lower terminating plane of the relay and whereby the sealing with casting resin between the bottom part and the coil body projections occurs in the height-offset joining plane.

In a further modification the bottom part can essentially extend only in the region of the height-offset bottom section, potentially with a rounded section adapted to the winding, and flange projections and/or column-shaped coil body projections having embedded terminal pins can extend between the edge of the cap and the bottom part and/or in clearances of the bottom part down to the lower terminating plane. When the terminal elements in this case are already tightly embedded in the flange projections or, respectively, in the column-shaped coil body projections, the sealing of the housing with casting resin need be undertaken only in the region of the height-offset joining plane.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
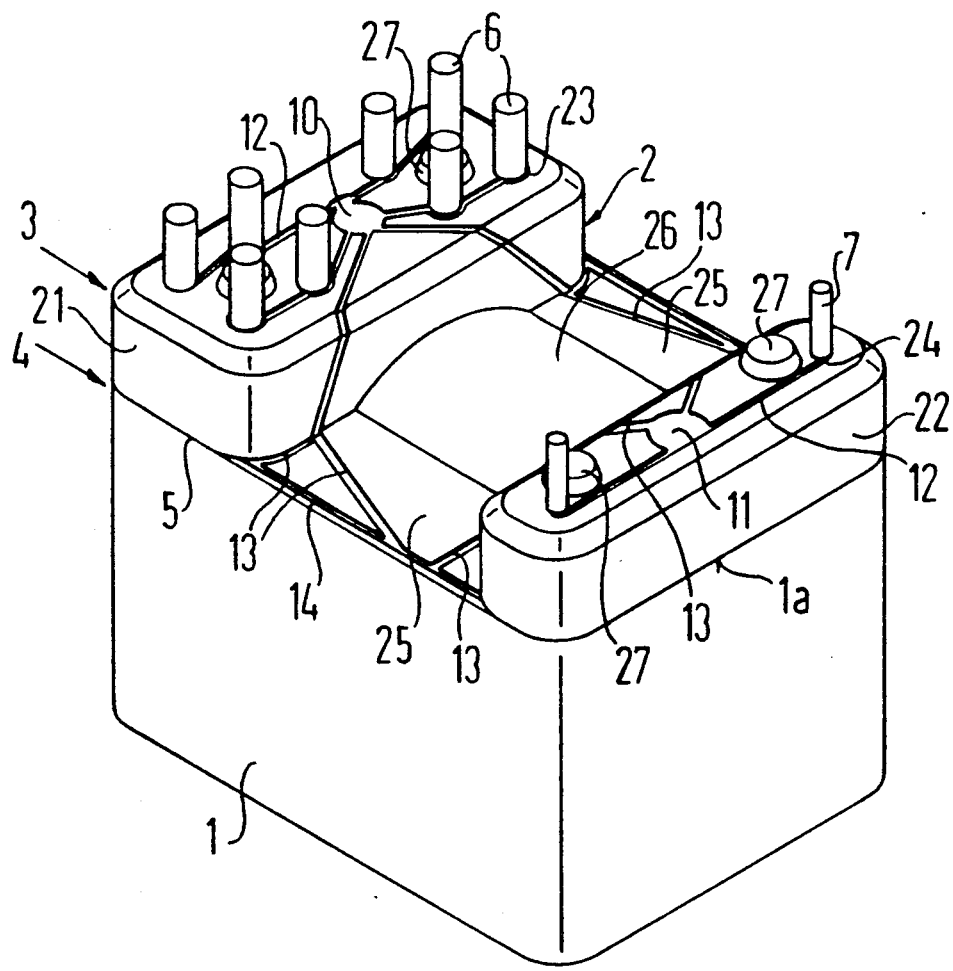
FIG. 1 is a perspective view of an inventively fashioned relay having a bottom part that embraces two coil flanges.

The relay shown in a perspective view in FIG. 1 with its terminal side toward the top has a housing that is formed of a cap 1 and of a bottom part 2. The coil body having a horizontal winding axis is completely enclosed in the housing in this embodiment. The cap, however, does not have its lower edge 1a (with reference to the normal integrated position) extending down to the lower terminating plane 3 of the relay. Rather, this only extends up to a height-offset joining plane 4 where a surrounding parting seam 5 that is to be sealed proceeds between the cap 1 and the bottom part 2.

The bottom part 2 has two cup-shaped bellied portions 21 and 22 that each respectively embrace a flange of the coil body and have respective clearances 23 or 24 for contact terminal elements 6 or, respectively, coil terminal elements 7 at the level of the lower terminating plane 3. In the region between the bellied portions 21 and 22, the bottom part has flat sections 25 extending at both sides of the coil winding in the height-offset joining plane 4, a rounded section 26 in the form of a cylindrical generated surface between these flat sections 25 tightly adjoining the lower apex region of the coil winding. Spacer noses 27 are also applied to the bellied portions 21 and 22 in the region of the lower terminating plane 3. These spacer noses 27 guarantee a small free space between the lower terminating surface 3 of the relay and a printed circuit board in a known way in the region of the terminal pins 6 or, respectively, 7 as well, allowing for soldering vapors and the like to be eliminated as a result thereof.

Moreover, the large free space under the coil between the lower terminating plane 3 and the joining plane 4 not only allows the arrangement of additional components under the relay but also facilitates the washing of the printed circuit board after the soldering process since only the minimal areas in the region of the terminal pins or, respectively, of the flanges cover relatively tightly the printed circuit board. The region under the coil is freely accessible even when the housing is closed.

The sealing ensues with casting resin that is supplied to all locations to be sealed via a capillary system. In the example of FIG. 1, two filling locations 10 and 11 are provided, respectively one on each of the two bellied portions 21 and 22 of the bottom part 2. Capillary channels 12 lead to the individual terminal pins 6 or, respectively, 7 from these filling or, respectively, dosing locations 10 or, respectively, 11. Further capillary channels 13 lead from the filling locations 10 and 11 via one or more side walls of the bellied portions 21 or, respectively, 22 to the height-offset bottom section 25, to an edge channel 14 and to all parting seams 5 between the cap 1 and the bottom part 2 that are to be sealed. In the example, it would also be adequate if the supply of the sealing locations in the height-offset region of the joining plane 4 were carried out proceeding from only one filling location 10. The shape of the filling locations and the shape and dimensioning of the capillary lines is only schematically indicted here. Of course, standard shapes of channels or ribs known to a person skilled in the art come into consideration, as already mentioned above. The dimensioning is based on the locations to be sealed, on the distance to these locations and on the properties of the casting resin.

Figure 2:
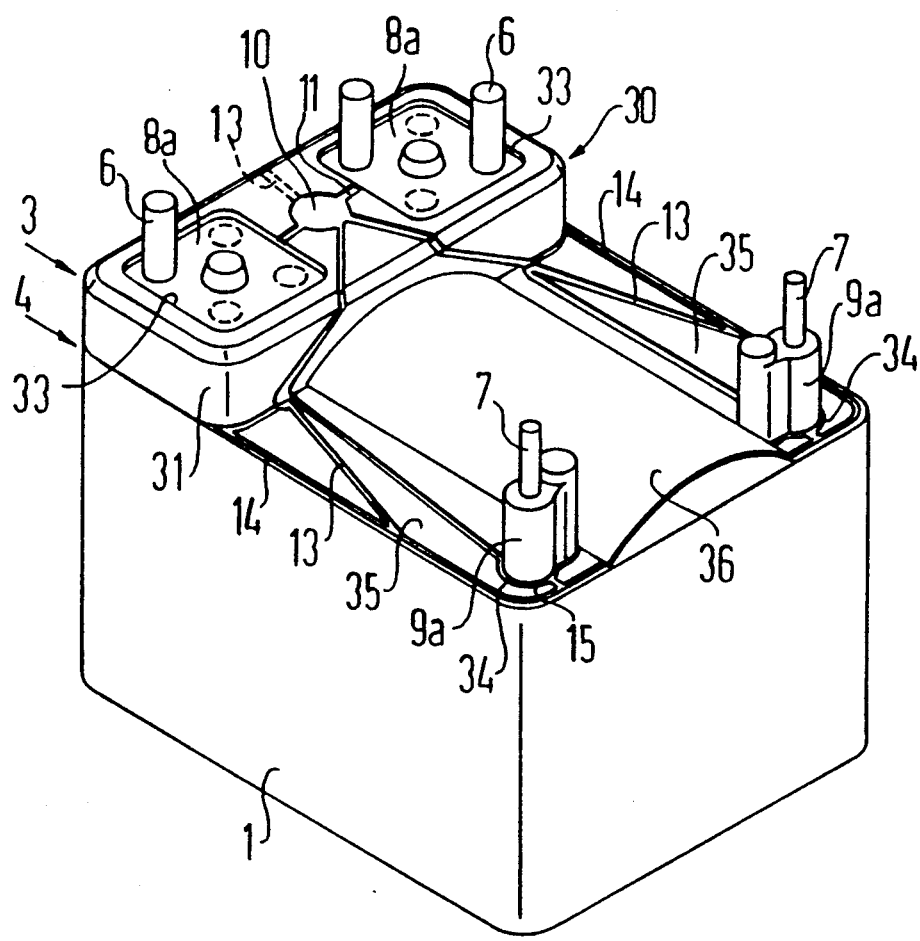
FIG. 2 is a perspective view of an embodiment modified in comparison to FIG. 1 wherein only one flange is clad by the bottom part.

FIG. 2 shows a modification of the relay housing of FIG. 1, whereby it is possible to carry out the entire sealing proceeding from a single filling location 10. In this case, a bottom part 30 has only one cup-shaped bellied portion 33 that embraces a flange 8 (see FIG. 3). Moreover, a height-offset bottom section 35 having a rounded section 36 extends at the level of the joining plane up to the opposite end of the relay, i.e. beyond the second flange 9 as well. This second flange 9 (FIG. 3) has only column-shaped projections 9a that are plugged through the bottom part in clearances 34 at the level of the joining plane 4. Since the coil terminal pins 7 are already tightly embedded in these column-shaped projections 9a, a sealing via the channels 15 which, like the remaining joins and edge channels 14, are supplied with casting resins from the common filling location 10 suffices.

The cup-shaped bellied portion 31 in the example of FIG. 2 does not have any clearances for the individual terminal pins 6 that are to be separately sealed but has two larger clearances 33 into which respective flange projections 8a of the coil body flange 8 project. By introducing casting resin into the clearances 33, the edge between the flange projections 8a and the bottom part is sealed, as are potentially clearances for the terminal pins 6 in the flange projections 8a in case the pins are not yet tightly embedded. A fastening of the terminal pins 6 by plugging and subsequent sealing or an embedding by injection molding or the like can thus be employed.

Figure 3:
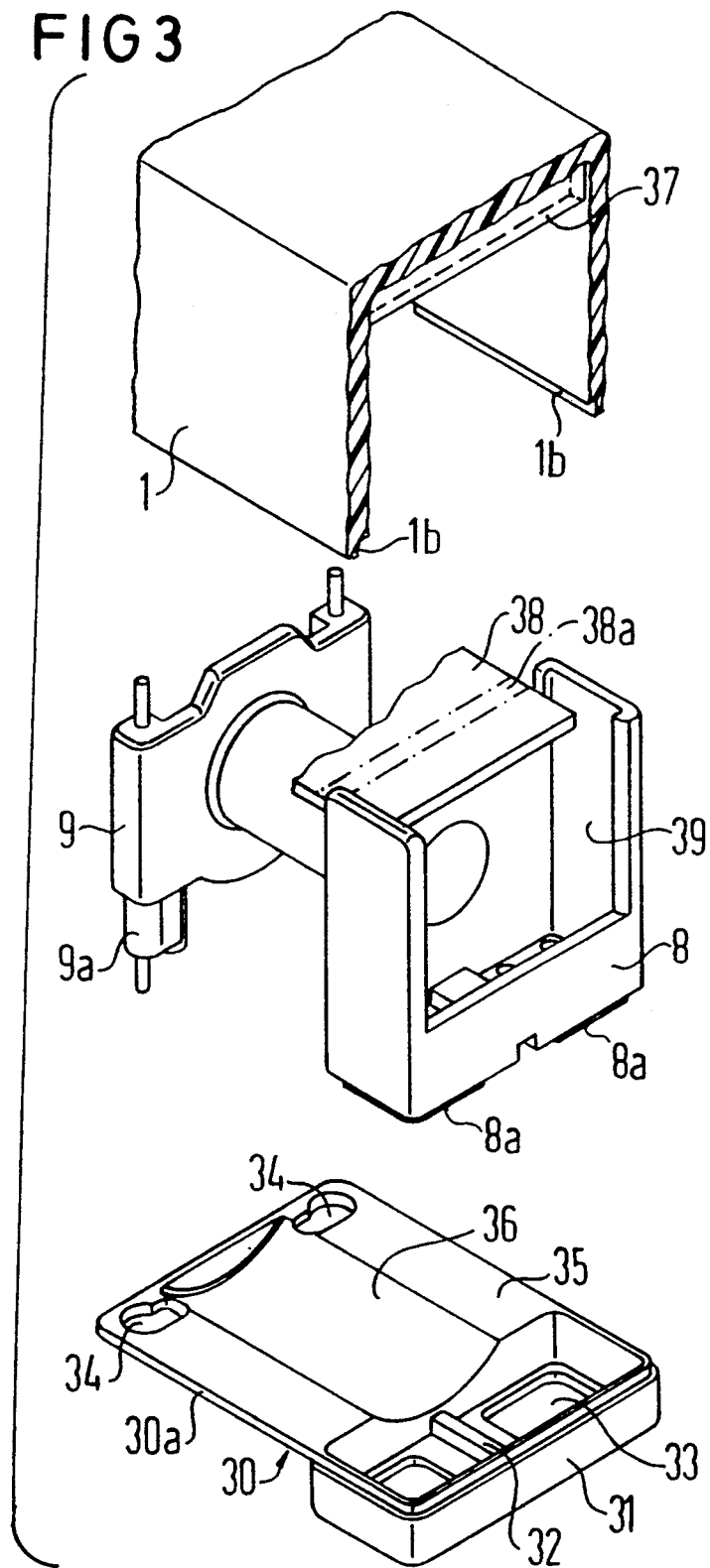
FIG. 3 is an exploded view of the housing element cap, of the an the bottom part of the relay of FIG. 2.

FIG. 3 shows a perspective view of those parts of the relay that form the housing or, respectively, that participate in the seal toward the outside. The bottom part 30 having the cup-shaped bellied portion 31 in which the clearances 33 are recessed is depicted. A rib 32 between the clearances serves the purpose of mechanical stabilization. However, it would also be conceivable that a single, large clearance 33 for a correspondingly large flange projection 8a could be provided in the bellied portion 31. The two smaller clearances 34 for the column-shaped projections 9a of the coil flange 9 are recessed at the other end of the bottom part 30 only in the height-offset bottom section 35. The cap 1 has an all around fold 1b with which it embraces the edge 30a of the bottom part and forms a sealable seam with the edge 30a on all sides.

As shown in FIG. 3, an inside rib 37 is applied to the inside of the cap, this inside rib 37 pressing against the yoke 38 (merely suggested) on the indicated contacting surface 38a after assembly. Together with the flange 8, the inside rib 37 thus forms a partition between the contact space 39 and the coil winding, so that particles from the coil winding space that are harmful to the contacts cannot reach the contacts. It would thereby also be conceivable to additionally seal the joins in the region of the inside rib 37 with casting resin or to also completely fill out the coil space with a sealing compound. This sealing compound could then guarantee an improved heat elimination from the coil toward the outside.

Figure 4:
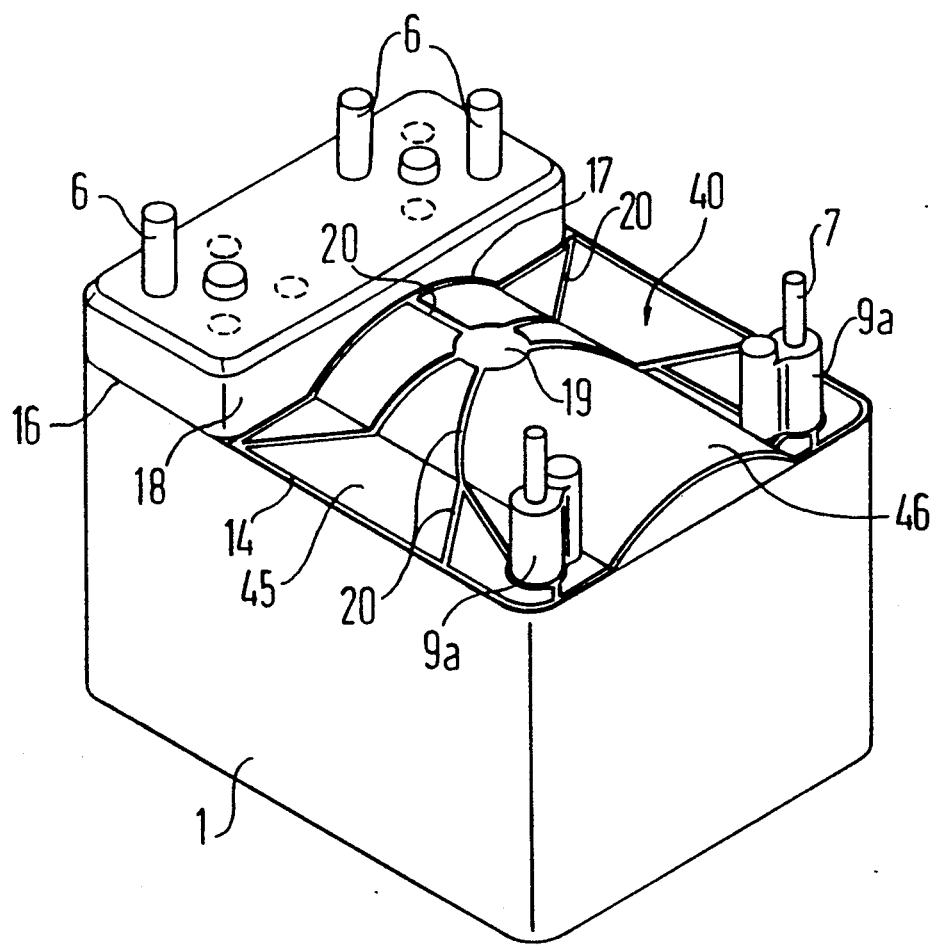
FIG. 4 and 5 perspective views of further modifications by comparison to FIG. 2.

FIG. 4 shows a further modification of the relay. In this case, a floor part 40 forms only the height-offset bottom section 45 having the rounded section 46, whereas a coil body projection 18 forms the entire housing part that extends down to the lower terminating plane. The terminal pins 6 in this case can be embedded in the coil body projection 18. As in the preceding example of FIG. 2, column-shaped coil body projections 9a are provided at the opposite end as continuations of the coil flange 9 and are conducted through the bottom part. The sealing in this case occurs between the cap 1 and the flange projection 18 in the sealing seam 16, between the cap 1 and the bottom part 40 in the region of the edge channel 14, as well as between the bottom part 40 and the flange projection 18 at the edge channel 17. The column-shaped coil body projections 9a are sealed as in the example of FIG. 2. The delivery of casting resin in this case proceeds from a central filling location 19 via capillary channels 20 on the bottom part.

Figure 5:
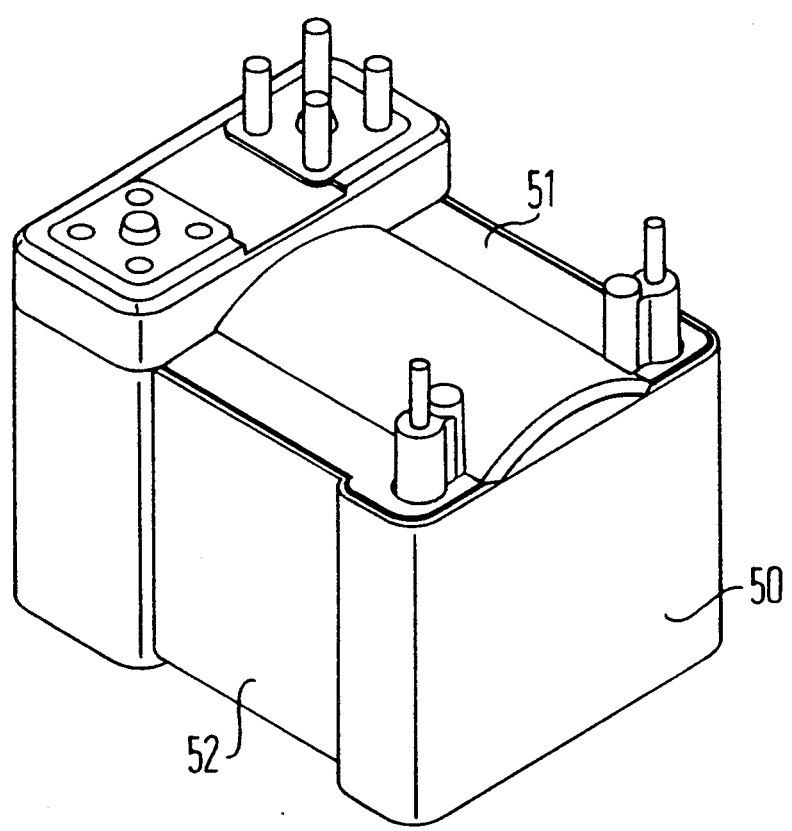

FIG. 5 shows a further modification of the housing of FIG. 2. Here, the housing is formed by a cap 50 in combination with a bottom part 51. Not only is a free space under the coil created in the above-recited way on the basis of a corresponding shaping of the bottom part 51 but the cap 50 is also provided with constrictions 52 to the side of the coil winding. As a result thereof, additional volume that is not required or, respectively, that cannot be used in the inside of the coil is displaced toward the outside and thereby becomes freely accessible. The housing volume is thus reduced overall, this, for example, also reducing the air volume in the relay. This air volume should be kept as small as possible since it enlarges in an undesirable way given temperature fluctuations and as a negative effect on the heat elimination overall. Otherwise, the shape and sealing procedure in the relay of FIG. 5 are the same as already set forth with reference to FIG. 2.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An electromagnetic relay having,
   a housing having a cap and a bottom part,
   a coil body having a winding applied between two flanges in the housing;
   at least one of the two flanges together with terminal elements anchored therein projecting beyond an outer circumference of the winding in a direction toward an underside of the relay and projecting down to a lower terminating plane of the housing,
   the terminal elements emerging from the relay in a region of the lower terminating plane, and clearances in the bottom part and a sealing seam between the bottom part and the cap sealed with casting resin, comprising:
   the bottom part having under the winding a bottom section height-offset at least up to the outer circumference of the winding, the bottom section together with the cap, which extends to the bottom section, having a joining plane having a sealing seam, the joining plane being height-offset relative to the lower terminating plane, the bottom part and the cap defining at least one interior portion of the housing that is free of casting resin.

2. The relay according to claim 1, wherein the height-offset bottom section and the joining plane to the cap at both sides of the winding lie higher than a lower apex of the winding; and wherein the bottom embraces the lower apex of the winding with a rounded section adapted thereto.

3. The relay according to claim 1, wherein the sealing seam between the cap and the bottom part proceeds all around at the level of the height-offset bottom section; and wherein the bottom part has a cup-shaped bellied portion embracing at least one flange of the two flanges projecting down to the lower terminating plane.

4. The relay according to claim 3, wherein at least one cup-shaped bellied portion is provided with clearances for terminal pins.

5. The relay according to claim 1, wherein the bottom part has at least one filling location for casting resin and a capillary distribution network for conveying casting resin to the clearances in the bottom part and to the sealing seam.

6. The relay according to claim 3, wherein the bottom part has capillary paths both on the respective bellied portion in the lower terminating plane as well as in the height-offset bottom section, the capillary paths respectively connecting a filling location for liquid casting resin to at least one of the clearances and the sealing seam in the joining plane.

7. The relay according to claim 6, wherein a common filling location is in communication both with the clearances in the bottom part and with the sealing seam in the joining plane.

8. The relay according to claim 4, wherein the cup-shaped bellied portion has at least one clearance in the region of the lower terminating plane, terminal pins clad individually or in common by flange projections of the coil body being conducted toward the outside in the at least one clearance, whereby a seal is at least between the flange projections and the bottom part.

9. The relay according to claim 1, wherein the height-offset bottom section extends at least beyond one flange of the two flanges up to an edge of the cap; and wherein clearances for terminal pins are provided in the bottom section, whereby the terminal pins are clad by column-shaped coil body projections that extend to the lower terminating plane, and whereby the sealing with casting resin occurs between the bottom part and the coil body projections in the height-offset joining plane.

10. The relay according to claim 1, wherein the bottom part substantially extends only in the region of the height-offset bottom section; and wherein at least one of flange projections and column-shaped coil body projections having embedded terminal pins extend down to at least one of the lower terminating plane between the cap edge and bottom part and clearances of the bottom part.

11. The relay according to claim 1, wherein the cap is provided with additional constrictions in the region laterally next to the coil winding.

12. The relay according to claim 8, wherein the seal is also between the terminal pins and the flange projections.

13. An electromagnetic relay having,
a housing having a cap and a bottom part,
a coil body having a winding applied between two flanges in the housing;
at least one of the two flanges together with terminal elements anchored therein projecting beyond an outer circumference of the winding in a direction toward an underside of the relay and projecting down to a lower terminating plane of the housing,
the terminal elements emerging from the relay in a region of the lower terminating plane, and clearances in the bottom part and a sealing seam between the bottom part and the cap sealed with casting resin, comprising:
the bottom part having under the winding a bottom section height-offset at least up to the outer circumference of the winding, the bottom section together with the cap, which extends to the bottom section, having a joining plane having a sealing seam, the joining plane being height-offset relative to the lower terminating plane, the bottom part and the cap defining at least one interior portion of the housing that is free of casting resin; the height-offset bottom section and the joining plane to the cap at both sides of the winding being higher than a lower apex of the winding; the bottom part embracing the lower apex of the winding with a rounded section adapted thereto; the sealing seam between the cap and the bottom part proceeding all around at the level of the height-offset bottom section; and the bottom part having a cup-shaped bellied portion embracing at least one flange of the two flanges projecting down to the lower terminating plane.

14. The relay according to claim 13, wherein at least one cup-shaped bellied portion is provided with clearances for terminal pins of the winding, and wherein the bottom part has at least one filling location for casting resin as well as capillary paths for conveying casting resin from the at least one filling location to the clearances in the bottom part and to the sealing seam.

15. The relay according to claim 14, wherein the bottom part has capillary paths both on the respective bellied portion in the lower terminating plane as well as in the height-offset bottom section, the capillary paths respectively connecting the at least one filling location for liquid casting resin to the clearances and to the sealing seam in the joining plane.

16. An electromagnetic relay having,
a housing having a cap and a bottom part,
a coil body having a winding applied between two flanges in the housing;
at least one of the two flanges together with terminal elements anchored therein projecting beyond an outer circumference of the winding in a direction toward an underside of the relay and projecting down to a lower terminating plane of the housing,
the terminal elements emerging from the relay in the region of the lower terminating plane, and clearances in the bottom part and a sealing seam between the bottom part and the cap sealed with casting resin, comprising:
the bottom part having under the winding a bottom section height-offset at least up to the outer circumference of the winding, the bottom section together with the cap, which extends to the bottom section, having a joining plane having a sealing seam, the joining plane being height-offset relative to the lower terminating plane, the bottom part and the cap defining at least one interior portion of the housing that is free of casting resin; the bottom part substantially extending only in the region of the height-offset bottom section; and at least one of flange projections and column-shaped coil body projecting having embedded terminal pins extend down to at least one of the lower terminating plane between the cap edge and bottom part and the clearances of the bottom part.

17. The relay according to claim 16, wherein the height-offset bottom section and the joining plane to the cap at both sides of the winding lie higher than a lower apex of the winding; and wherein the bottom part embraces the lower apex of the winding with a rounded section adapted thereto.

* * * * *